United States Patent
Choi et al.

(10) Patent No.: US 10,304,995 B2
(45) Date of Patent: May 28, 2019

(54) FLEXIBLE ELECTRIC DEVICE AND METHOD OF MANUFACTURING THE SAME

(71) Applicant: Samsung Electronics Co., Ltd., Suwon-Si, Gyeonggi-Do (KR)

(72) Inventors: Jun-hee Choi, Seongnam-si (KR); Yun-seong Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 199 days.

(21) Appl. No.: 14/198,748

(22) Filed: Mar. 6, 2014

(65) Prior Publication Data
US 2015/0060874 A1    Mar. 5, 2015

(30) Foreign Application Priority Data

Sep. 3, 2013 (KR) .................. 10-2013-0105688

(51) Int. Cl.
| | |
|---|---|
| *H01L 33/24* | (2010.01) |
| *H01L 29/20* | (2006.01) |
| *H01L 33/00* | (2010.01) |
| *H01S 5/02* | (2006.01) |
| *H01L 33/44* | (2010.01) |
| *H01L 33/54* | (2010.01) |

(52) U.S. Cl.
CPC .......... *H01L 33/24* (2013.01); *H01L 33/0079* (2013.01); *H01S 5/0206* (2013.01); *H01L 33/44* (2013.01); *H01L 33/54* (2013.01)

(58) Field of Classification Search
CPC ..... H01L 33/0079; H01L 33/24; H01L 33/44; H01L 33/54; H01S 5/0206
See application file for complete search history.

(56) References Cited

U.S. PATENT DOCUMENTS

| | | | | |
|---|---|---|---|---|
| 8,847,229 B2* | 9/2014 | Suzuki | .................. | H01L 29/786 257/59 |
| 9,627,653 B2* | 4/2017 | Uezawa | .................. | G02B 5/021 |
| 2003/0006697 A1* | 1/2003 | Weaver | .............. | H01L 27/3246 313/503 |
| 2009/0103161 A1* | 4/2009 | Kothari | ............... | G02F 1/13306 359/245 |

(Continued)

FOREIGN PATENT DOCUMENTS

| | | | |
|---|---|---|---|
| CH | 704452 | * | 8/2012 |
| JP | 2007519214 A | | 7/2007 |

(Continued)

OTHER PUBLICATIONS

Chung et al. "Transferable GaN Layers Grown on ZnO-Coated Graphene Layers for Optoelectronic Devices"; Science vol. 330, pp. 655-657; 2010.

(Continued)

*Primary Examiner* — Tom Thomas
*Assistant Examiner* — Benjamin T Liu
(74) *Attorney, Agent, or Firm* — Harness, Dickey & Pierce, P.L.C.

(57) ABSTRACT

A flexible electric device includes a first electrode on a flexible member, at least one semiconductor element on the first electrode, at least one filling region adjacent to the semiconductor element and a second electrode on the semiconductor element.

9 Claims, 6 Drawing Sheets

(56) References Cited

U.S. PATENT DOCUMENTS

| | | | |
|---|---|---|---|
| 2010/0210040 A1* | 8/2010 | Basol | H01L 31/03928 |
| | | | 438/4 |
| 2011/0198625 A1* | 8/2011 | Yoon | H01L 33/24 |
| | | | 257/88 |
| 2011/0240953 A1* | 10/2011 | Ellinger | H01L 33/005 |
| | | | 257/9 |
| 2012/0056237 A1* | 3/2012 | Choi | H01L 21/02422 |
| | | | 257/103 |
| 2012/0126277 A1* | 5/2012 | Tanaka | H01L 51/50 |
| | | | 257/99 |
| 2012/0222732 A1* | 9/2012 | Choi | H01L 33/007 |
| | | | 136/255 |
| 2012/0295376 A1 | 11/2012 | Lee et al. | |
| 2012/0295379 A1* | 11/2012 | Sonoda | C23C 14/042 |
| | | | 438/34 |

FOREIGN PATENT DOCUMENTS

| | | |
|---|---|---|
| KR | 20120127882 A | 11/2012 |
| KR | 20130008224 A | 1/2013 |

OTHER PUBLICATIONS

Kobayashi et al., Layered Boron Nitride as a Release Layer for Mechanical Transfer of GAN-Based Devices, Nature 484,223-227(Apr. 12, 2012)doi:10.1038/nature10970.

Kim et al., Supporting Information, www.pnas.org/cgi/doi/10.1073/pnas.1102650108, pp. 1-10 (2011).

Park et al., Printed Assemblies of Inorganic Light-Emitting Diodes for Deformable and Semitransparent Displays, Science 325, 977 (2009).

* cited by examiner

FLEXIBLE ELECTRIC DEVICE AND METHOD OF MANUFACTURING THE SAME

CROSS-REFERENCE TO RELATED APPLICATIONS

This application claims the benefit of Korean Patent Application No. 10-2013-0105688, filed on Sep. 3, 2013, in the Korean Intellectual Property Office, the disclosure of which is incorporated herein in its entirety by reference.

BACKGROUND

1. Field

Some example embodiments relate to a flexible electric device and/or a method of manufacturing the flexible electric device.

2. Description of the Related Art

With the demand for increased usability of electric devices, research into an electric device having a flexible characteristic whereby it may be bent in a variety of shapes according to circumstances is being conducted. Semiconductor devices include optoelectronic devices that uses an optoelectronic characteristic of a semiconductor material. An optoelectronic device includes a device for converting electrical energy into optical energy and a device for converting optical energy into electrical energy. A device for converting electrical energy into optical energy includes a luminous device or a light-emitting device, such as a light-emitting diode (LED), a laser diode (LD), etc. A device for converting optical energy into electrical energy includes a photovoltaic device such as a solar cell, a photodiode, etc.

A conventional inorganic GaN light-emitting diode (LED) has various characteristics such as high efficiency, high luminance, and a long life span. During manufacturing of a GaN based LED that is widely used among conventional inorganic semiconductor devices, semiconductor materials are grown by using a sapphire substrate, a glass substrate, or a silicon substrate. Accordingly, there is a limit in producing products having a variety of shapes, particularly in embodying products capable of being bent or extended.

SUMMARY

Some example embodiments provide a flexible electric device having a relatively large size and in which a leakage current may be prevented or mitigated.

Other example embodiments provide a method of manufacturing the flexible electric device.

Additional aspects will be set forth in part in the description which follows and, in part, will be apparent from the description, or may be learned by practice of example embodiments.

According to an example embodiment, a flexible electric device includes a first electrode on a flexible member, at least one semiconductor element on the first electrode, at least one filling region adjacent to the semiconductor element, and a second electrode on the semiconductor element.

The flexible electric device may further include a buffer layer between the semiconductor element and the second electrode, wherein the second electrode may be on a surface of the filling region.

The semiconductor element may include a Group III-V semiconductor. The Group III-V semiconductor may include at least one of GaN, InGaN, AlGaN, and AlInGaN.

The semiconductor element may include a first semiconductor layer, a second semiconductor layer, and an active layer between the first and second semiconductor layers. The flexible electric device may further include a mask layer and a buffer layer between the semiconductor element and the second electrode, wherein the second semiconductor layer contacts the buffer layer via an opening portion of the mask layer and the mask layer is between the buffer layer and the second semiconductor layer.

The semiconductor element may have a core-shell structure. The filling region may be formed of one of an insulating polymer, spin-on-glass (SOG), and photoresist. The filling region may be between the first and second electrodes.

According to another example embodiment, a method of manufacturing a flexible electric device includes forming a semiconductor element on a substrate, transferring the semiconductor element onto a flexible member by separating the substrate and the semiconductor element, and forming a filling region adjacent to the semiconductor element by performing surface processing in a defect area of the substrate.

Prior to forming the semiconductor element, the method may further include forming a metal layer on the substrate, and forming a buffer layer on the metal layer, wherein the semiconductor element may be formed on the buffer layer. The method may further include transferring the semiconductor element onto a flexible member, forming a first electrode on the semiconductor element, attaching the flexible member to the first electrode, and separating the metal layer and the buffer layer.

Forming the filling region may include coating an insulating material over the defect area of a surface of the buffer layer that is separated from the metal layer. The filling region may be formed of one of an insulating polymer, spin-on-glass (SOG), and photoresist.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
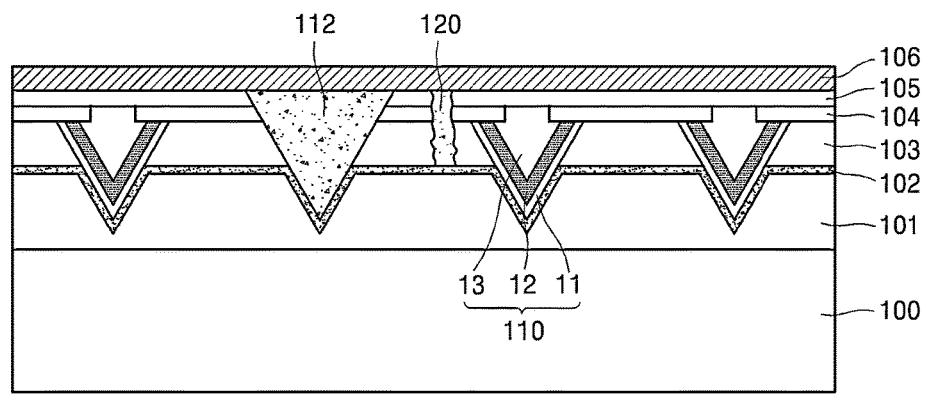
FIGS. 1A and 1B are sectional views illustrating structures of a flexible electric device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the drawings, the same reference numerals denote the same elements, and sizes or thicknesses of elements may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
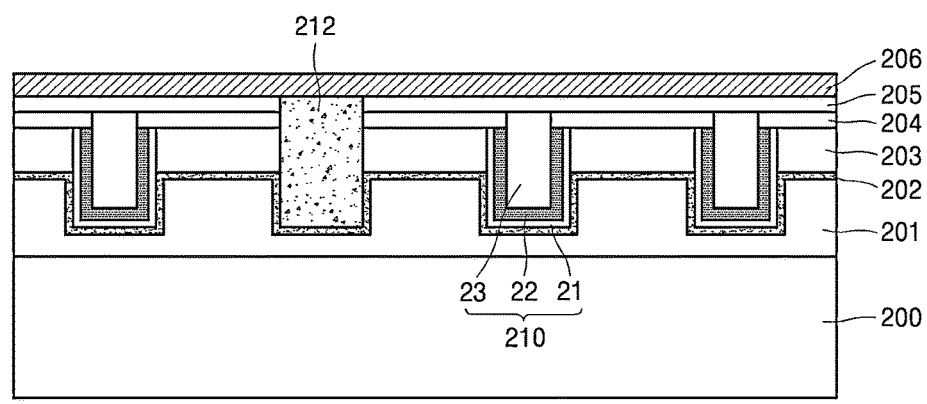

FIGS. 1A and 1B are sectional views illustrating structures of a flexible electric device according to an example embodiment.

Referring to FIG. 1A, a flexible electric device according to the present embodiment may include a flexible member 100 and at least one semiconductor element 110 formed on the flexible member 100. When the semiconductor element 110 is provided in multiple numbers, these semiconductor elements 110 may be separated apart from each other. The semiconductor element 110 may be formed between a first electrode 102 and a second electrode 106. The first electrode 102 may be formed between the flexible member 100 and the semiconductor element 110. The first electrode 102 may be formed directly on the flexible member 100. An embedded layer 101 may be further formed between the first electrode 102 and the flexible member 100. The embedded layer 101 may be formed to improve an adhesive force between the first electrode 102 and the flexible member 100. An insulating layer 103 may be formed at opposite side portions of the semiconductor element 110 on the first electrode 102. When the semiconductor element 110 is provided in multiple numbers, the insulating layer 103 may be formed between neighboring semiconductor elements 110. Filling regions 112 and 120 may be formed adjacent to the semiconductor element 110. The filling regions may be defect regions that may be generated during a manufacturing process of a flexible electric device according to the present embodiment. The filling regions 112 and 120 may be formed by using a filling material in the defect regions. The second electrode 106 may be formed between the semiconductor element 110 and the filling regions 112 and 120. A buffer layer 105 may be formed between the semiconductor element 110 and the second electrode 106. A mask layer 104 may be formed in a partial area between the buffer layer 105 and the semiconductor element 110. Alternatively, the mask layer 104 may be formed between the insulating layer 103 and the buffer layer 105.

The flexible member 100 may be formed by including elastomer which may be an elastic polymer. The flexible member 100 may be polyethylene terephthalate (PET), polydimethylsiloxane (PDMS), polyurethane, polyester, or a mixture including at least one of these materials. The flexible member 100 may be light-transmissive.

The embedded layer 101 may be formed of a polymer. The embedded layer 101 may be polyethylene terephthalate (PET), polydimethylsiloxane (PDMS), polyurethane, polyester, ultraviolet epoxy, or a mixture including at least one of these materials. The embedded layer 101 may have flexibility like the flexible member 100 and may improve an adhesive force between the flexible member 100 and the first electrode 102.

The semiconductor element 110 may include at least one semiconductor material layer. For example, when the semiconductor element 110 is a semiconductor light-emitting structure, the semiconductor element 110 may include a first semiconductor layer 11, a second semiconductor layer 13, and an active layer 12 between the first semiconductor layer 11 and the second semiconductor layer 13. The first semiconductor layer 11 may be a first conductive semiconductor layer and the second semiconductor layer 13 may be a second conductive semiconductor layer. The first conductive semiconductor layer may be a p-type or n-type semiconductor layer. When the first conductive semiconductor layer is a p-type semiconductor layer, the second semiconductor layer may be an n-type semiconductor layer.

The semiconductor element 110 may include an inorganic compound semiconductor, for example, a group III-V compound semiconductor. The group III-V compound semiconductor may be a GaN based compound semiconductor and may include at least one of GaN, InGaN, AlGaN, and AlInGaN. The first semiconductor layer 11 may include n-type GaN and the second semiconductor layer 13 may include p-type GaN. The first semiconductor layer 11 may include p-type GaN and the second semiconductor layer 13 may include n-type GaN. The active layer 12 may have a structure in which a quantum well layer and a quantum barrier layer are alternately stacked. The active layer 12 may have a single quantum well (SQW) structure or a multi-quantum well (MQW) structure. For example, the active layer 12 may have a structure in which InGaN and GaN are alternately stacked. The semiconductor element 110 may have a superlative structure or a vertical structure having multiple semiconductor layers.

The semiconductor element 110 may be formed in a variety of shapes, for example, a pyramid shape or a rod shape, but is not limited thereto. FIG. 1A illustrates an example in which the semiconductor element 110 is formed in a pyramid shape. FIG. 1B illustrates an example in which a semiconductor element 210 has a rod shape. Referring to FIG. 1B, the flexible electric device according to the present embodiment may include a flexible member 200 and at least one semiconductor element 210 formed on the flexible member 200. The semiconductor element 210 may be formed between a first electrode 202 and a second electrode 206. When the semiconductor element 210 is a semiconductor light-emitting structure, the semiconductor element 210 may include a first semiconductor layer 21, a second semiconductor layer 23, and an active layer 22 formed between the first semiconductor layer 21 and the second semiconductor layer 23. The semiconductor element 210 may have a rod shape or a cylindrical shape. Descriptions of an embedded layer 201, an insulating layer 203, a filling region 212, a mask layer 203, and a buffer layer 205 in FIG. 1B may be the same as those of the elements having corresponding names of FIG. 1A.

The semiconductor element 110 may be formed in a core-shell structure. For example, the active layer 12 surrounds a peripheral portion of the second semiconductor layer 13 of FIG. 1A except for a part thereof and the first semiconductor layer 11 surrounds a peripheral portion of the active layer 12 except for a part thereof. In this case, the second semiconductor layer 13 may become a core part and the second semiconductor layer 11 may become a shell part.

The semiconductor element 110 may be electrically connected to the first electrode 102 and the second electrode 106. The semiconductor element 110 may be driven by supplying power through the first electrode 102 and the second electrode 106. The first electrode 102 may be a lower electrode and the second electrode 106 may be an upper electrode or a rear electrode.

The first and second electrodes 102 and 106 may be formed of a conductive material such as metal, a conductive metal oxide, or a conductive metal nitride. At least one of the first and second electrodes 102 and 106 may be formed of a transparent conductive material. At least one of the first and second electrodes 102 and 106 may be a reflective electrode. The first and second electrodes 102 and 106 may be formed of a material including Ag, Au, Al, Pd, Pt, Ti, and Ni, or at least one thereof, or may be formed in a multilayer structure such as Ti/Ag, Ti/Au, or Ni/Au. The first and second electrodes 102 and 106 may be formed of a material such as graphene or indium tin oxide (ITO).

The insulating layer 103 may be formed of an electrically insulating material, for example, a silicon oxide, a silicon nitride, or an insulating polymer. The insulating layer 103 may have a flexible characteristic.

The mask layer 104 may be formed of a silicon oxide or a silicon nitride. An opening portion in the form of a hole may be provided between the buffer layer 105 and the second semiconductor layer 13.

The buffer layer 105 functions as a seed layer to grow the semiconductor element 110 during a manufacturing process. The buffer layer 105 may include a group III-V compound semiconductor. For example, the buffer layer 105 may include at least one of GaN, AlN, InGaN, AlGaN, and AlInGaN. The buffer layer 105 may include low temperature (LT)-GaN or a material based on LT-GaN. LT-GaN and LT-AlN may be a material formed at a relatively low temperature of, for example, about 450° C.~650° C.

The filling regions 112 and 120 may be formed of an insulating material such as an insulating polymer, such as polyimide (PI), SU8, etc., spin-on-glass (SOG), photoresist, etc. The filling regions 112 and 120 may be formed between the first electrode 102 and the second electrode 106 and may be formed in contact or non-contact with the first electrode 102. To operate the flexible electric device, power may be supplied through the first and second electrodes 102 and 106. The filling regions 112 and 120 are formed by coating, with an insulating polymer, defect areas that may be generated during the manufacturing of the flexible electric device. If the defect area is not filled with an insulating polymer, for example, when power is supplied through the first and second electrodes 102 and 106, a leakage current may be generated due to the existence of the defect area. Accordingly, in the flexible electric device according to the present embodiment, since the defect areas are formed in the filling regions 112 and 120 during the manufacturing of the flexible electric device, a leakage current of the flexible electric device is greatly reduced and thus, reliability of the flexible electric device may be improved.

Figure 2:
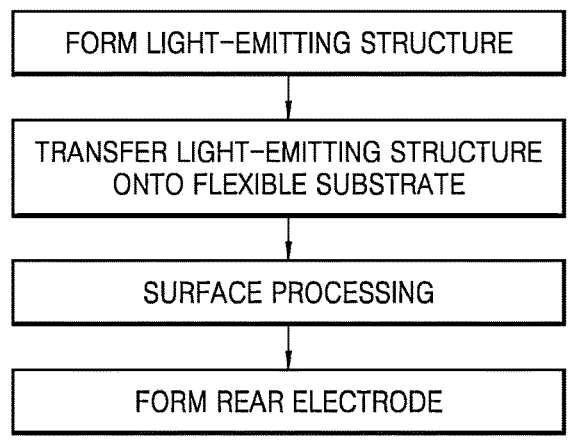
FIG. 2 is a flowchart for explaining a method of manufacturing a flexible electric device according to another example embodiment.

FIG. 2 is a flowchart for explaining a method of manufacturing a flexible electric device according to another example embodiment.

Referring to FIG. 2, a semiconductor element is formed to form a flexible electric device. The semiconductor element may be selectively formed according to the type of a desired flexible electric device. The semiconductor elements may be, for example, a light-emitting structure, and may include the active layer 12 formed between the first and second semiconductor layers 11 and 13, as illustrated in FIG. 1A. After the semiconductor element is formed, the semiconductor element may be transferred onto a flexible member. The semiconductor element may be formed on a substrate for growth such as a silicon or glass substrate. The method may include a process of separating the semiconductor element from the substrate for growth before transferring the semiconductor element onto the flexible member. Since a defect area may be formed in the process of separating the semiconductor element from the substrate for growth, surface processing is performed so that the defect area may be formed in a filling region using an insulating polymer. Electrodes are formed in an area on which the surface processing is performed and thus the flexible electric device may be formed.

The above-described manufacturing method will be described in detail with reference to FIGS. 3A through 3H. FIGS. 3A through 3H are sectional views illustrating a method of manufacturing a flexible electric device according to another example embodiment.

Figure 3A:
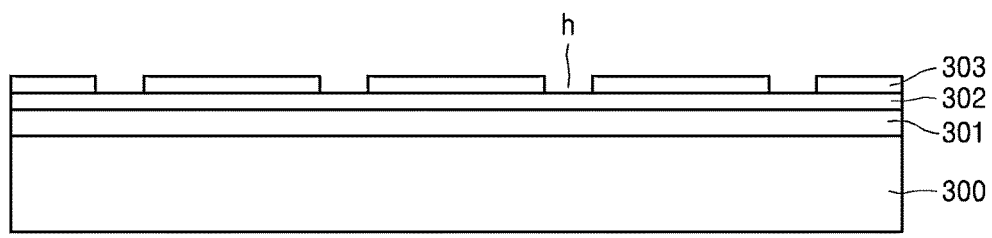
FIGS. 3A through 3H are sectional views illustrating a method of manufacturing a flexible electric device according to another example embodiment.

Referring to FIG. 3A, a metal layer 301 is formed on a substrate 300. The substrate 300 may be a glass substrate, a silicon substrate, or a sapphire substrate. The metal layer 301 may be formed of, for example, Ti, but is not limited thereto. A buffer layer 302 is formed on the metal layer 301. The buffer layer 302 functions as a seed layer to grow a semiconductor element. The buffer layer 302 may be formed at a temperature that is relatively lower than a temperature for forming a semiconductor layer of the semiconductor element that is formed above the buffer layer 302. A mask layer 303 is formed on the buffer layer 302. After the mask layer 303 is formed, an opening portion "h" in the form of a hole is formed in an area where the semiconductor element is formed. The size of the semiconductor element formed above the mask layer 303 may be appropriately adjusted by adjusting the diameter of the opening portion "h". The mask layer 303 may be formed of a silicon oxide or a silicon nitride.

Figure 3B:
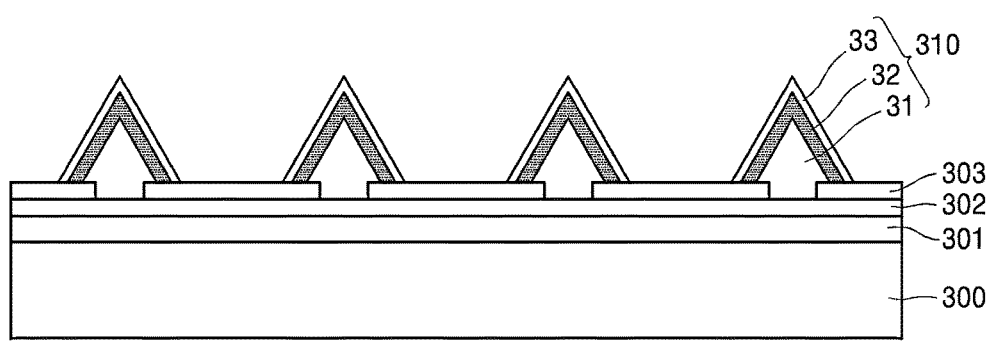

Referring to FIG. 3B, a semiconductor element 310 is formed on the buffer layer 302 that is exposed by the opening portion "h" of the mask layer 303. The semiconductor element 310 may be selectively grown only in the opening portion "h" of the buffer layer 302. The semiconductor element 310 may be epitaxially grown by using, for example, a metal organic chemical vapor deposition (MOCVD) process or a molecular beam epitaxy process. A second semiconductor layer 31 may be formed in the form of a pyramid on the buffer layer 302. An active layer 32 and a first semiconductor layer 33 may be sequentially grown on the second semiconductor layer 31. The second semiconductor layer 31 may be formed on the surfaces of the buffer layer 302 and the mask layer 303. The active layer 32 and the first semiconductor layer 33 may be sequentially formed on the second semiconductor layer 31 without contacting the buffer layer 302. The second semiconductor layer 31 may be formed at a temperature that is relatively higher than a temperature for forming the first semiconductor layer 33. The active layer 32 may be formed in a multiplayer structure including a compound semiconductor, for example, in a InGaN/GaN MQW structure. The semiconductor element 310 may be formed at a temperature range of about 600° C. to about 1100° C., but example embodiments are not limited thereto.

Voids may be formed at an interface between the metal layer 301 and the buffer layer 302 in the above process. For example, when the metal layer 301 is formed of Ti and the buffer layer 302 is formed of a GaN-based material, if a high temperature process is performed at a temperature of about 1000° C. in the process of forming the semiconductor element 301, nitrogen N from GaN of the buffer layer 302 is dispersed into the metal layer 301, thereby forming TiN. Accordingly, nano-voids may be formed between the metal layer 301 and the buffer layer 302.

Alternatively, to decrease a cohesion force between the metal layer 301 and the buffer layer 302, after forming the semiconductor element 310, an adhesive layer is attached onto a given (or, alternatively predetermined) adhesive tape on the semiconductor element 310 to contact an upper portion of the semiconductor element 301. After being aligned on the semiconductor element 310, the adhesive tape and the adhesive layer are heated up to a temperature Tg at which viscosity of the adhesive layer is shown. When the temperature is beyond Tg, the upper portion of the semiconductor element 310 is completely covered with the adhesive layer. At this time, heating is stopped and after a predetermine time passes, the adhesive tape and the adhesive layer are separated from the semiconductor element 310. Accordingly, the size of a void between the metal layer 301 and the buffer layer 302 may be increased.

Figure 3C:
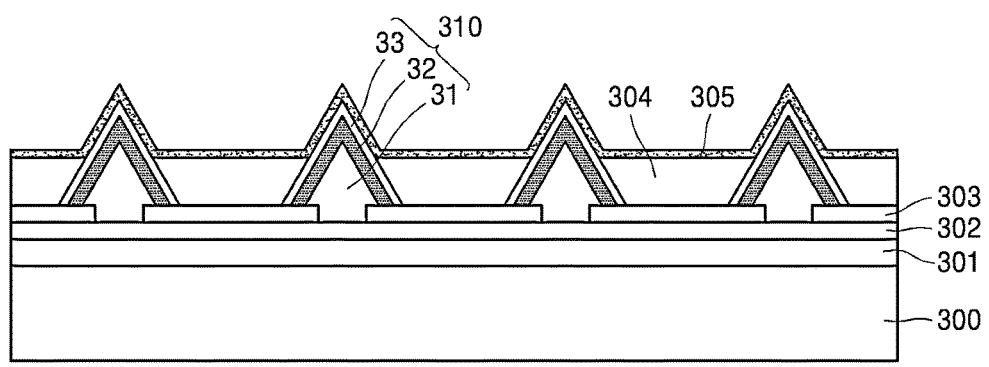

Referring to FIG. 3C, an insulating layer 304 is formed on the mask layer 303 between the semiconductor elements 301 that neighbor each other. The insulating layer 304 is formed to cover a part of the surface of the first semiconductor layer 33 of the semiconductor element 310 such that the upper surface of the insulating layer 304 may be lower than the top portion of the first semiconductor layer 33. Then, a first electrode 305 is formed on the upper surface of the insulating layer 304 and an exposed surface of the first semiconductor layer 33.

Figure 3D:
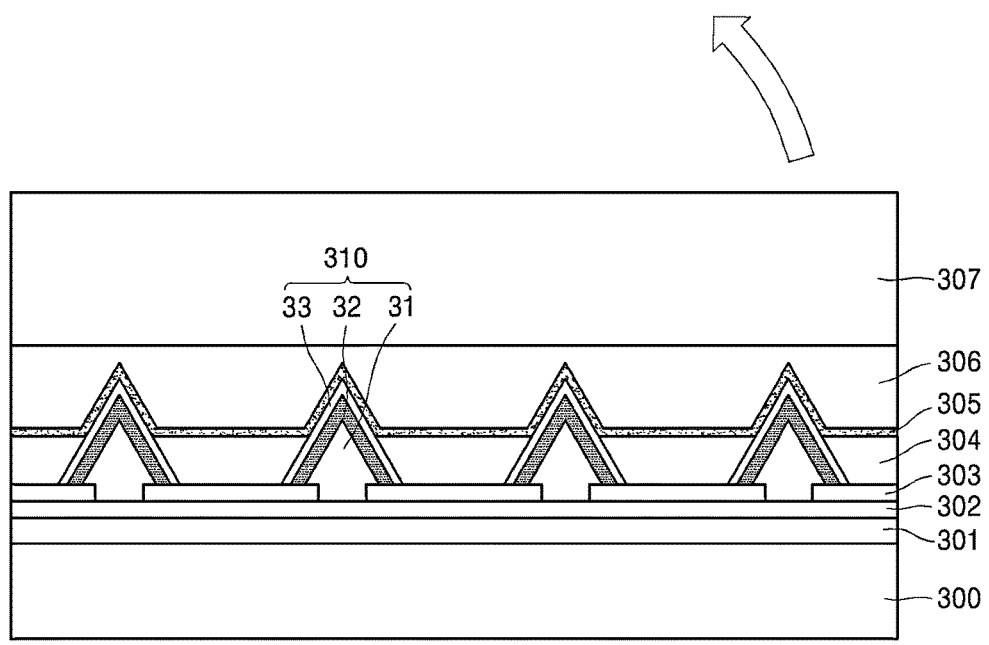

Referring to FIG. 3D, a transfer process of attaching the first electrode 305 onto a flexible member 307 is performed. An embedded layer 306 may be formed on a surface of the flexible member 307 that is attached to the first electrode 305. Accordingly, the first electrode 305 and the flexible member 307 may be attached with the embedded layer 306 interposed therebetween to be strongly compared to the adhesion between the metal layer 301 and the buffer layer 302. Then, the metal layer 301 and the buffer layer 302 are separated in a direction indicated by an arrow in FIG. 3D. As described above, since voids are formed between the metal layer 301 and the buffer layer 302, an adhesive force between the metal layer 301 and the buffer layer 302 is weakened and thus the metal layer 301 and the buffer layer 302 may be easily separated from each other.

Figure 3E:
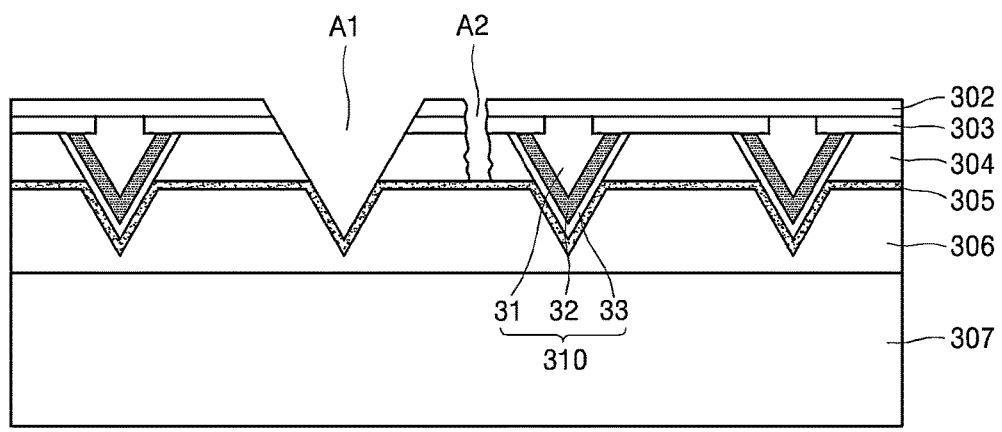

Referring to FIG. 3E, the buffer layer 302 may not be completely separated from the metal layer 301 during the separating of the metal layer 301 from the buffer layer 302. Accordingly, a partial area of the buffer layer 302 and some of the semiconductor elements 310 are not properly separated and thus a defect may be generated. A defect area A1 is generated as one of the semiconductor elements 310 is not properly separated. A defect area A2 is generated in a partial area of the buffer layer 302 and even in the mask layer 303 and the insulating layer 304 thereunder. When a conductive material layer is formed for an electrode process and the defect area is left as it is, and power is supplied to drive a flexible electric device, a short-circuit may occur with respect to the first electrode 305 and a leakage current may be generated. To remove the defect area, surface processing may be performed as illustrated in FIG. 2.

Figure 3F:
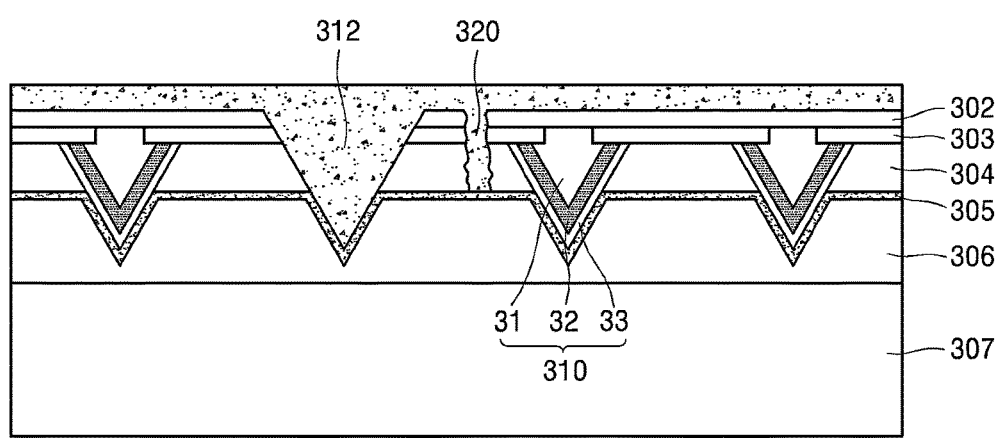

Referring to FIG. 3F, an insulating polymer, SOG, or photoresist is coated on the buffer layer 302. Accordingly, filling regions 312 and 320 are formed in the defect areas A1 and A2 of FIG. 3E. The filling regions 312 and 320 may be formed by, for example, spin coating an insulating material.

Figure 3G:
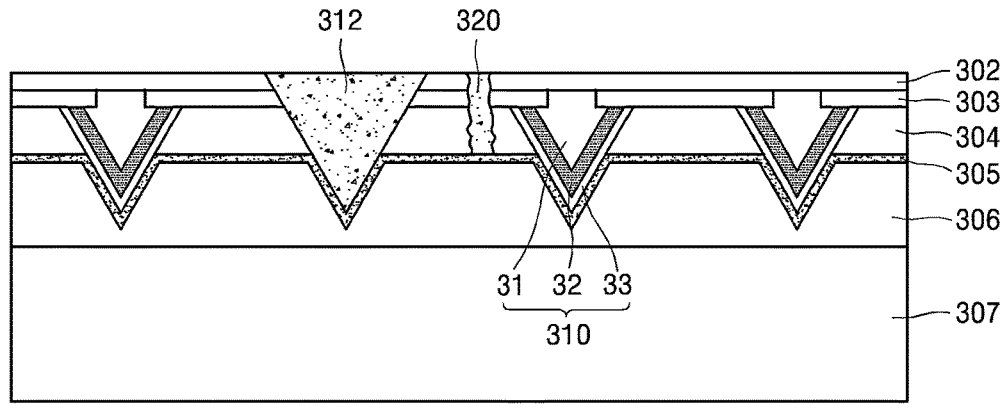

Referring to FIG. 3G, a process of removing from the buffer layer 302 the insulating material layer coated to form the filling regions 312 and 320 is performed. For example, an ashing process and $O_2$ plasma may be used for this purpose. Accordingly, the insulating material formed on the buffer layer 302 is removed and thus the surface of the buffer layer 302 is exposed.

Figure 4A:
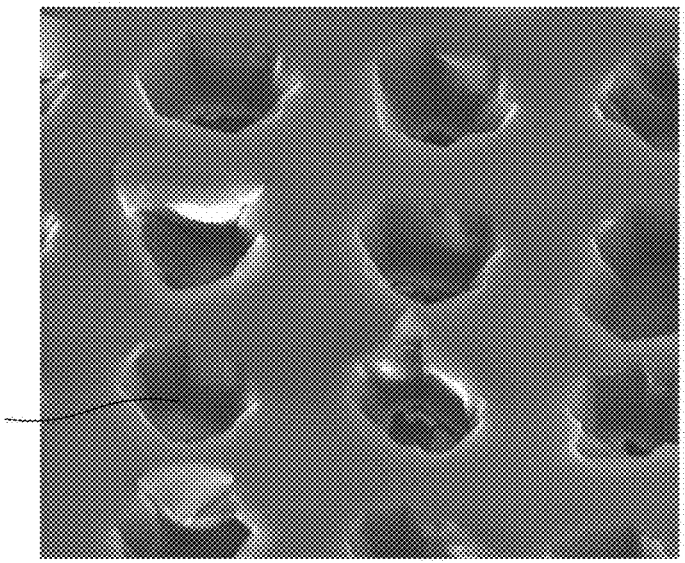
FIGS. 4A and 4B are scanning electron microscope (SEM) images showing a surface processing process of a manufacturing process of a flexible electric device according to another example embodiment.
Figure 4B:
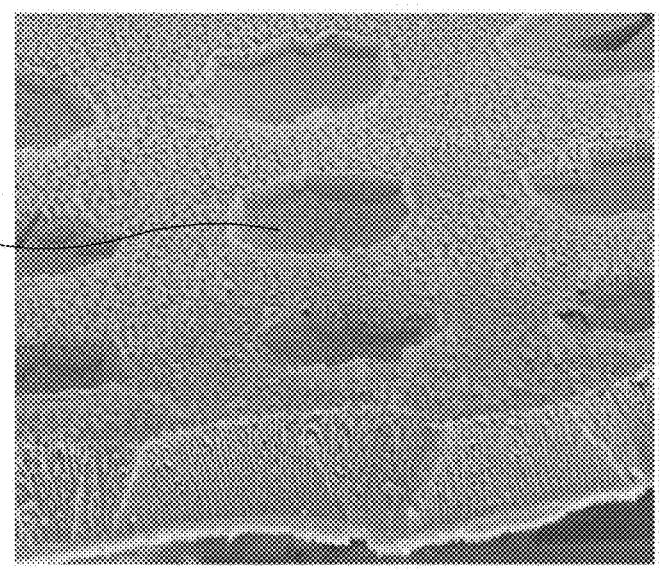

FIGS. 4A and 4B are scanning electron microscope (SEM) images showing a surface processing process of a manufacturing process of a flexible electric device according to another example embodiment. Referring to FIGS. 4A and 4B, a portion where the defect area A1 is formed is coated with an insulating polymer by spin coating and an ashing process is performed, thereby forming the filling area 312.

Figure 3H:
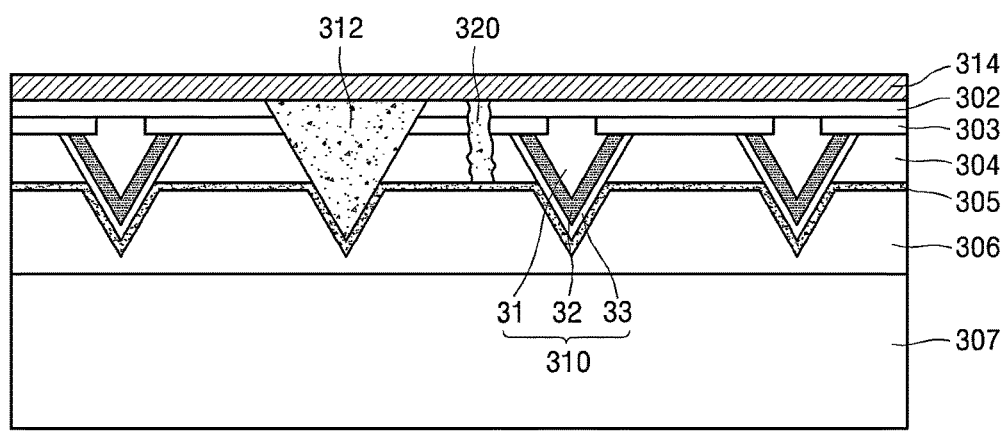

Referring to FIG. 3H, a second electrode 314 is formed on the buffer layer 302 and the filling regions 312 and 320. The second electrode 314 may be formed of metal, a conductive metal oxide, or a conductive metal nitride. The second electrode 314 may be formed of a transparent conductive material or a conductive material having a high reflectance.

When the second electrode 314 is formed on surfaces of the filling regions 312 and 320 and power is supplied through the first and second electrodes 305 and 314 to drive a flexible electric device, generation of a leakage current may be prevented or mitigated and reliability of the flexible electric device may be improved.

According to an example embodiment, a flexible electric device capable of being modified into a variety of shapes may be provided. Also, a defect that may be generated during manufacturing of a flexible electric device may be prevented or mitigated and thus a leakage current may be prevented or mitigated. Furthermore, a flexible electric device having a large size may be provided at a low cost.

It should be understood that the example embodiments described herein should be considered in a descriptive sense only and not for purposes of limitation. Descriptions of features or aspects within each embodiment should typically be considered as available for other similar features or aspects in other embodiments. For example, those of ordinary skill in the art may see that the structure of the flexible electric device illustrated in FIGS. 1A and 1B may be variously modified. For example, a semiconductor element may be applied not only to a light-emitting structure but also to various types of semiconductor devices. While example embodiments have been described with reference to the figures, it will be understood by those of ordinary skill in the art that various changes in form and details may be made therein without departing from the spirit and scope of the following claims.

What is claimed is:

1. A flexible electric device comprising:
   a first electrode on a flexible member;
   a plurality of semiconductor elements on the first electrode;
   an insulating layer between adjacent ones of the plurality of semiconductor elements;
   at least one filling region between a pair of the semiconductor elements directly adjacent to each other; and
   a second electrode on the plurality of semiconductor elements,
   wherein the at least one filling region is a defect region formed using a filling material having an insulating property in the defect region and extending from the first electrode to the second electrode to pass through the insulating layer,
   wherein the filling material is between the pair of semiconductor elements and spaced apart from the pair of semiconductor elements,
   wherein a top surface of the at least one filling region is covered with the second electrode, and
   wherein a topmost surface of the filling material is at a level higher than a topmost surface of the plurality of semiconductor elements.

2. The flexible electric device of claim 1, further comprising:
   a buffer layer between the plurality of semiconductor elements and the second electrode,
   wherein the second electrode is on a surface of the at least one filling region.

3. The flexible electric device of claim 1,
   wherein the plurality of semiconductor elements includes a Group III-V semiconductor.

4. The flexible electric device of claim 3, wherein the Group III-V semiconductor comprises at least one of GaN, InGaN, AlGaN, and AlInGaN.

5. The flexible electric device of claim 1, wherein the plurality of semiconductor elements comprises a first semiconductor layer, a second semiconductor layer, and an active layer between the first and second semiconductor layers.

6. The flexible electric device of claim 5, further comprising:
   a mask layer and a buffer layer between the plurality of semiconductor elements and the second electrode,
   wherein the second semiconductor layer is in direct contact with the buffer layer via an opening portion of the mask layer, and the mask layer is between the buffer layer and the second semiconductor layer.

7. The flexible electric device of claim 1,
   wherein the plurality of semiconductor elements have a core-shell structure.

8. The flexible electric device of claim 1,
   wherein the at least one filling region is formed of one of an insulating polymer, spin-on-glass (SOG), and photoresist.

9. The flexible electric device of claim 1, wherein the at least one filling region is between the first and second electrodes.

* * * * *